(12) United States Patent
Arita

(10) Patent No.: US 6,333,537 B1
(45) Date of Patent: Dec. 25, 2001

(54) THIN FILM CAPACITOR WITH AN IMPROVED TOP ELECTRODE

(75) Inventor: Koji Arita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/255,843

(22) Filed: Feb. 23, 1999

(30) Foreign Application Priority Data

Feb. 23, 1998 (JP) .................................................. 10-040472

(51) Int. Cl.⁷ ........................ H01C 27/108; H01C 29/76; H01C 29/54; H01C 31/119
(52) U.S. Cl. .............................................. 257/310; 257/758
(58) Field of Search ................................... 257/295, 310, 257/758, 769

(56) References Cited

U.S. PATENT DOCUMENTS

| | | |
|---|---|---|
| 5,668,040 | 9/1997 | Byun . |
| 5,708,284 | 1/1998 | Onishi . |
| 5,774,327 | 6/1998 | Park . |
| 5,807,774 | 9/1998 | Desu et al. . |
| 5,879,957 | 3/1999 | Joo . |
| 5,924,590 | 10/1998 | New . |
| 6,011,284 | 1/2000 | Katori et al. . |
| 6,020,233 | 2/2000 | Kim . |
| 6,025,257 | 2/2000 | Jeon . |
| 6,048,737 | 4/2000 | Chung et al. . |
| 6,071,787 | 6/2000 | Joo . |
| 6,096,592 | 8/2000 | Cho . |
| 6,107,136 | 8/2000 | Mclnick et al. . |

FOREIGN PATENT DOCUMENTS

| | | |
|---|---|---|
| 7-93969 | 4/1995 | (JP) . |
| 9-116111 | 5/1997 | (JP) . |
| 10-12751 | 1/1998 | (JP) . |
| 10-12830 | 1/1998 | (JP) . |

*Primary Examiner*—Sheila V. Clark
(74) *Attorney, Agent, or Firm*—Young & Thompson

(57) ABSTRACT

A top electrode of a thin film capacitor includes a dielectric oxide layer, a first conductive layer on the dielectric oxide layer, and a second conductive layer over the first conductive layer, wherein the first conductive layer processes at least one of a lower oxidizability and a lower diffusability than the second conductive layer.

24 Claims, 8 Drawing Sheets

THIN FILM CAPACITOR WITH AN IMPROVED TOP ELECTRODE

BACKGROUND OF THE INVENTION

The present invention relates to a thin film capacitor and a method of forming the same, and more particularly to a thin film capacitor with an improved top electrode suitable for advanced semiconductor devices and advanced integrated circuits and a method of forming the same at high throughput and high yield.

As a degree of integration of semiconductor memory devices such as dynamic random access memories has been on the increase, various kinds of high dielectric oxide such as (Ba, Sr)TiO$_3$ have been on active investigations for a dielectric film of a thin film capacitor, instead of silicon dioxide or silicon nitride.

When the high dielectric oxide is used for the dielectric film of the thin film capacitor, a polysilicon electrode is not useable due to a problem with possible oxidation of an interface of the polysilicon electrode with the high dielectric oxide film, for which reason metals such as Pt, Ru and conductive metal oxide as well as conductive nitrides such as TiN have also been on the investigation for electrodes of the thin film capacitor.

The thin film capacitors having the high dielectric oxide layer sandwiched between top and bottom electrodes have been investigated and reported mostly about improvements in capacitance characteristic and current leakage characteristics both of which are important factors for the thin film capacitors.

A first prior art about the top electrode of the thin film capacitor was reported in Japan Applied Physics Association 1997, No. 2, p. 398. The thin film capacitor has a Ru/(Ba, Sr)TiO$_3$/Ru structure, wherein a (Ba, Sr)TiO$_3$ dielectric layer is deposited by a metal organic chemical vapor deposition method whilst Ru top and bottom electrodes are deposited by a DC sputtering method. Good capacitance characteristics and current leakage characteristics can t)c obtained such that a silicon conversion thickness is 0.34 nanometers and a density of a leak current is in the order of 1×10$^{-8}$ A/cm$^2$.

A second prior art of the thin film capacitor was reported in Japanese Journal of Applied Physics, Vol. 36, No. 9B, pp. 5860–5865. The thin film capacitor has a Pt/(Ba, Sr)TiO$_3$/Pt structure, wherein a (Ba, Sr)TiO$_3$ dielectric layer is deposited by a radio frequency magnetron sputtering method whilst Pt top and bottom electrodes are deposited by a DC sputtering method. There was investigated variations in current leakage of the thin film capacitor over deposition conditions for a second DC sputtering process for the Pt top electrode It was confirmed that under application of a voltage of −1V, the leakage of current at a DC power of 0.2 kW is smaller by two or three digits than at DC powers of 0.5 kW and 1.0 kW. The reason why the leakage of current is reduced is that the roughness of an interface of the top electrode with the high dielectric oxide film reduces a Schottky barrier height of the interface between the top electrode and the high dielectric oxide film.

However, other prior arts than the above are directed to the high dielectric oxide layers and the bottom electrode structures whilst the prior art directed to the top electrode structure is rare case. The bottom electrode and the high dielectric oxide layer are likely to be strongly influenced by later processes, for which reason most of the development and investigation was directed to the bottom electrode and the high dielectric oxide layer. On the other hand, the top electrode is in major cases grounded, for which reason the top electrode has received weak attention or concern.

The present inventor has investigated possible various factors of the top electrode which might provide influences to the thin film capacitor and could confirm the fact that an interface state between the high dielectric oxide layer and the top electrode provides large influences to the current leakage characteristic and the adhesion between them for the thin film capacitor.

For example, the above first prior art thin film capacitor of the Ru/(Ba, Sr)TiO$_3$/Ru structure shows the good leakage characteristic of 1×10$^{-8}$ A/cm$^2$. Notwithstanding, the first prior art thin film capacitor of the Ru/(Ba, Sr)TiO$_3$/Ru structure was placed in oxygen gas or nitrogen gas at 500° C. for 30 minutes in order to have confirmed a temperature hysteresis, whereby the leakage characteristic is deteriorated. The causes of the deterioration in the current leakage characteristic has been investigated with TEM observation and local EDX analysis and could confirm the fact that the deterioration in the current leakage characteristic is caused by both oxidation of Ru on an interface between the Ru top electrode layer and the (Ba, Sr)TiO$_3$ high dielectric oxide layer and a diffusion of Ru from the Ru top electrode layer into the (Ba, Sr)TiO$_3$ high dielectric oxide layer.

In general, the top electrode as formed receives a beat treatment such as an anneal at a temperature of not less than 350° C. for formation of interconnections extending over the thin film capacitor or a passivation film overlying the thin film capacitor, for which reason if a highly oxidizable metal is used for the top electrode, then a thermal oxidation of the metal may appear whereby the current leakage characteristic is deteriorated.

It was also confirmed by the present inventor that if the top electrode was deposited by a sputtering method under a condition of a high voltage application to a sputter target, then the oxidation of Ru and the diffusion of Ru from the top electrode into the (Ba, Sr)TiO$_3$ high dielectric oxide layer could be observed even though no heat treatment was carried out.

Meanwhile, the above second prior art shows the fact that the current leakage characteristic could be improved by two or three digits by drop of a power of the DC sputtering process for reduction in deposition rate. Table 1 on page 5860 of Japanese Journal of Applied Physics shows that in order to obtain the improvement by two Or three digits of the current leakage characteristic, it is required to remarkably reduce the deposition rate of the top electrode down to about one quarter. Such remarkable reduction in deposition rate causes a undesirable reduction in throughput, whereby productivity of the thin film capacitor is thus dropped.

An adhesiveness of the second prior art thin film capacitor of the Pt/(Ba, Sr)TiO$_3$/Pt structure was evaluated and it was confirmed that the adhesiveness of the film is lowered by drop of the power applied to the target during the DC sputtering process. Such reduction in the adhesiveness of the film increases a probability of peeling the film, whereby reliability of the semiconductor device and the yield thereof are thus reduced.

It is preferable to use Pt for the top electrode in light of prevention of oxidation at the top electrode interface with the high dielectric oxide layer and of the diffusion of Pt into the high dielectric oxide layer. The use of Pt for the top electrode, however, raises a problem with irradiation of alpha-ray from Pt. Namely, if the Pt top electrode layer is thick, then a sufficiently large amount of alpha-ray for causing a soft error is irradiated from the thick Pt top electrode layer. This means that so long as Pt is used for the top electrode, it is required to form a thin Pt top electrode in order to prevent the soft error.

In addition, Japanese laid-open patent publication No. 7-221197 addresses a Ru bottom electrode for the thin film capacitor but is silent on the structure of the top electrode.

Further, Japanese laid-open patent publication No. 8-17806 addresses a method of forming a thin film capacitor having the Pt/(Ba, Sr)TiO$_3$/Pt structure but is silent on the structure of the top electrode and on any influence to the capacitance characteristic by use of Pt for the top electrode.

In the above circumstances, it had been required to develop a novel thin film capacitor with an improved top electrode structure which makes the thin film capacitor free form any problems and disadvantages as described above and a novel method of forming the same.

SUMMARY OF THE INVENTION

Accordingly, it is an object of the present invention to provide a novel thin film capacitor with an improved top electrode structure which makes the thin film capacitor free from any problems and disadvantages as described above.

It is a further object of the present invention to provide a novel thin film capacitor with an improved top electrode structure free from the problems with oxidation of an interface of the top electrode with a high dielectric oxide layer.

It is a still further object of the present invention to provide a novel thin film capacitor with an improved top electrode structure free from the problems with diffusion of a metal of the top electrode into a high dielectric oxide layer.

It is a further more object of the present invention to provide a novel thin film capacitor with an improved top electrode structure which allows the thin film capacitor to keep excellent current leakage characteristic even after a heat treatment has been carried out at a high temperature.

It is still more object of the present invention to provide a novel top electrode structure on a high dielectric oxide layer of a thin film capacitor, wherein the top electrode structure makes the thin film capacitor free form any problems and disadvantages as described above.

It is moreover object of the present invention to provide a novel top electrode structure on a high dielectric oxide layer of a thin film capacitor, wherein the top electrode structure is free from the problems with oxidation of an interface of the top electrode with a high dielectric oxide layer.

It is another object of the present invention to provide a novel top electrode structure on a high dielectric oxide layer of a thin film capacitor, wherein the top electrode structure is free from the problems with diffusion of a metal of the top electrode into a high dielectric oxide layer.

It is still another object of the present invention to provide a novel top electrode structure on a high dielectric oxide layer of a thin film capacitor, wherein the top electrode structure allows the thin film capacitor to keep excellent current leakage characteristic even after a heat treatment has been carried out at a high temperature.

It is yet another object of the present invention to provide a novel method of forming a thin film capacitor for a rising throughput of the thin film capacitor.

It is further another object of the present invention to provide a novel method of forming a thin film capacitor for improvement in adhesiveness of the films of the thin film capacitor It is an additional object of the present invention to provide a novel method of forming a thin film capacitor for improvement in yield of the films of the thin film capacitor It is a still additional object of the present invention to provide a novel method of forming a top electrode on a high electric oxide layer of a thin film capacitor for rising throughput of the thin film capacitor It is yet an additional object of the present invention to provide a novel method of forming a top electrode on a high electric oxide layer of a thin film capacitor for improvement in adhesiveness of the films of the thin film capacitor.

It is a further additional object of the present invention to provide a novel method of forming a top electrode on a high electric oxide layer of a thin film capacitor for improvement in yield of the films of the thin film capacitor.

It is also additional object of the present invention to provide a novel method of forming a top electrode on a high electric oxide layer of a thin film capacitor for making the thin film capacitor free from the above problems and disadvantages.

The present invention provides a multi-layer structure comprising: a dielectric oxide layer; a first conductive layer on the dielectric oxide layer, and a second conductive layer over the first conductive layer, wherein the first conductive layer processes at least any one of a lower oxidizability and a lower diffusability than the second conductive layer.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DESCRIPTION OF THE PREFERRED EMBODIMENTS

Figure 1:
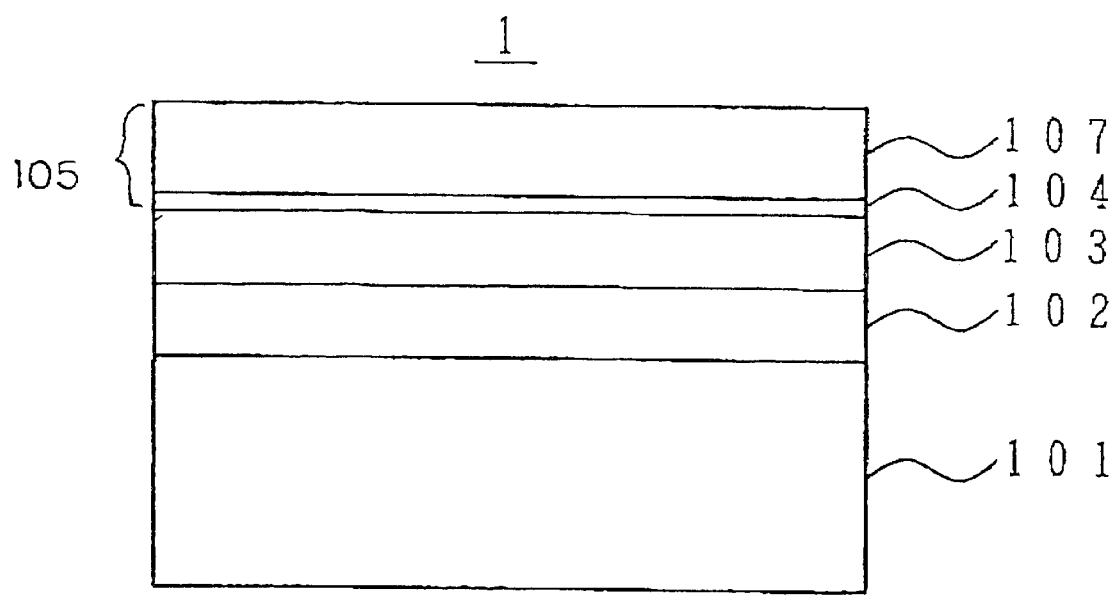
FIG. 1 is a fragmentary across sectional elevation view illustrative of a novel thin film capacitor with an improved top electrode in accordance with the present invention.

The first aspect of the present invention provides a multi-layer structure comprising: a dielectric oxide layer; a first conductive layer on the dielectric oxide layer; and a second conductive layer over the first conductive layer, wherein the first conductive layer processes at least any one of a lower oxidizability and a lower diffusability than the second conductive layer.

The term "oxidizability" means a property showing oxidation. High oxidizability means a high or strong property showing oxidation, whilst low oxidizability means a low or weak property showing oxidation. The term "diffusability" means a property showing diffusion. High diffusability means a high or strong property showing diffusion, whilst low diffusability means a low or weak property showing diffusion.

Since the first conductive layer in contact with the dielectric oxide layer possesses at least any one of a lower oxidizability and a lower diffusability than the second conductive layer, there could be prevented at least any one of an oxidation of an interface of the first conductive layer with the dielectric oxide layer and a diffusion of a material of the first conductive layer into the dielectric oxide layer. This preventing of at least any one of the oxidation and the diffusion contributes to prevent deteriorations of capacitance characteristics, particularly preventing an increase in the density of leak current across the interface between the first conductive layer and the dielectric layer. Thus, the above novel top electrode structure allows the novel thin film capacitor to suppress the leak current density lower than the conventional thin film capacitor. Namely, the above novel top electrode structure allows the interface between the first conductive layer and the dielectric oxide layer to be free from influences of a high temperature heat treatment to be carried out after the first and second conductive layers have been formed. So long as the thin film capacitor has the above multi-layer structure on the dielectric oxide layer, then the thin film capacitor is free from the deterioration of the current leakage characteristic due to the high temperature heat treatment to be carried out after the first and second conductive layers have been formed.

It is preferable that the first conductive layer processes both the lower oxidizability and the lower diffusability than the second conductive layer. Since the first conductive layer in contact with the dielectric oxide layer possesses both the lower oxidizability and the lower diffusability than the second conductive layer, there could surely be prevented both the oxidation of the interface of the first conductive layer with the dielectric oxide layer and the diffusion of the material of the first conductive layer into the dielectric oxide layer The prevention of both the oxidation and the diffusion more strongly and effectively contributes to prevent deteriorations of capacitance characteristics, particularly preventing an increase in the density of leak current across the interface between the first conductive layer and the dielectric layer. Thus, the above novel top electrode structure allows the novel thin film capacitor to suppress the leak current density lower than the conventional thin film capacitor. Namely, the above novel top electrode structure allows the interface between the first conductive layer and the dielectric oxide layer to be fret from influences of a high temperature heat treatment to be carried out after the first and second conductive layers have been formed. So long as the thin film capacitor has the above multi-layer structure on the dielectric oxide layer, then the thin film capacitor is free from the deterioration of the current leakage characteristic due to the high temperature heat treatment to be carried out after the first and second conductive layers have been formed.

It is further preferable that the first conductive layer includes at least any one of Pt, Au, Ag, Pd, Ni, Co and alloys thereof. When Pt is used for the first conductive layer, then the Pt first conductive layer is thin or not thick whilst the second conductive layer is made of a different conductive material than Pt, for which reason the thin film capacitor is fee from the problem with the soft error. Further, it is preferable to use Pt for the first conductive film in light of the prevention of both the oxidation of the interface of the first conductive layer with the dielectric oxide layer and the diffusion of Pt into the dielectric oxide layer.

It is also preferable that the second conductive layer possesses a higher formability than the first conductive layer. The term "formability" means a degree of easiness of forming or shaping the layer. High formability means a high degree of easiness of forming or shaping the layer, whilst low formability means a low degree of easiness of forming or shaping the layer. When the first conductive film is made of a low formability material such as Pt in light of the prevention of both the oxidation of the interface of the first conductive layer with the dielectric oxide layer and the diffusion of Pt into the dielectric oxide layer, the second conductive layer is made of a conductive material of a high formability for compensation to the low formability of the first conductive layer This allows a further substantive scaling down of the thin film capacitor with a high accurate dimension. This further substantive scaling down of the thin film capacitor allows an increase in density of integration of the semiconductor devices and integrated circuits.

It is further preferable that the second conductive layer possesses a higher formability to a reactive ion etching than the first conductive layer. When the first conductive film is made of a low formability material such as Pt in light of the prevention of both the oxidation of the interface of the first conductive layer with the dielectric oxide layer and the diffusion of Pt into the dielectric oxide layer, the second conductive layer is made of a conductive material of a high formability for compensation to the low formability of the first conductive layer. This allows a further substantive scaling down of the thin film capacitor with a high accurate dimension to be defined by the reactive ion etching. This further substantive scaling down of the thin film capacitor allows an increase in density of integration of the semiconductor devices and integrated circuits.

It is further more preferable that the second conductive layer includes at least any one of Ru, $RuO_2$, Ir, $IrO_2$, and alloys thereof because those materials have high formability to the reactive ion etching. This allows a further substantive scaling down of the thin film capacitor with a high accurate dimension to be defined by the reactive ion etching This further substantive scaling down of the thin film capacitor allows an increase in density of integration of the semiconductor devices and integrated circuits.

It is also preferable that the dielectric oxide layer comprises a high dielectric oxide layer.

It is further preferable that the high dielectric oxide layer consists essentially of $(Ba, Sr)TiO_3$.

It is also preferable that the first conductive layer has a thickness in the range of one-tenth to one-twentieth of a thickness of the second conductive layer. Namely, it is preferable that the first conductive layer is much thinner than the second conductive layer. When the thinner first conductive film is made of a low formability material such as Pt in light of the prevention of both the oxidation of the interface of the first conductive layer with the dielectric oxide layer and the diffusion of Pt into the dielectric oxide layer, the thicker second conductive layer is made of a conductive material of a high formability for sufficient compensation to the low formability of the first conductive layer. This allows a further substantive scaling down of the thin film capacitor with a high accurate dimension to be defined by the reactive ion etching. This further substantive scaling down of the thin film capacitor allows an increase in density of integration of the semiconductor devices and integrated circuits. Further, when Pt is used for the first conductive layer, then the Pt first conductive layer is much thinner than the second conductive film whilst the second conductive layer is made of a different conductive material than Pt, for which reason the much thinner film capacitor is free from the problem with the soft error. Further, it is preferable to use Pt for the first conductive film in light of the prevention of both the oxidation of the interface of the first conductive layer with the dielectric oxide layer and the diffusion of Pt into the dielectric oxide layer. Moreover, since the much thinner thickness of the first conductive layer in contact with the dielectric oxide layer is sufficient for showing both the sufficient low oxidizability and diffusability for surely preventing both the oxidation of the interface of the first conductive layer with the dielectric oxide layer and the diffusion of the material of the first conductive layer into the dielectric oxide layer. The prevention of both the oxidation and the diffusion more strongly and effectively contributes to prevent deteriorations of capacitance characteristics, particularly preventing an increase in the density of leak current across the interface between the first conductive layer and the dielectric layer. Thus, the above novel top electrode structure allows the novel thin film capacitor to suppress the leak current density lower than the conventional thin film capacitor. Namely, the above novel top electrode structure allows the interface between the first conductive layer and the dielectric oxide layer to be free from influences of a high temperature heat treatment to be carried out after the first and second conductive layers have been formed. So long as the thin film capacitor has the above multi-layer structure on the dielectric oxide layer, then the thin film capacitor is free from the deterioration of the current leakage characteristic due to the high temperature heat treatment to be carried out after the first and second conductive layers have been formed.

It is also preferable that the first conductive layer has a single-layered structure.

It is also preferable that the first conductive layer has a plural-layered structure.

It is also preferable that the second conductive layer has a single-layered structure.

It is also preferable that the second conductive layer has a plural-layered structure.

It is also preferable that an interface between the first conductive layer and the dielectric oxide layer is such that a density of a leak current across the interface is suppressed at not higher than $1 \times 10^{-4}$ A/cm$^2$ upon applying a voltage of 2V across the dielectric oxide layer.

The second aspect of the present invention provides a top electrode structure of a thin film capacitor. The structure comprises: an intervening conductive layer on a dielectric oxide layer; and a top electrode layer over the intervening conductive layer, and the top electrode layer being thicker than the intervening conductive layer, wherein the intervening conductive layer processes at least any one of a lower oxidizability and a lower diffusability than the top electrode layer.

Since the intervening conductive layer in contact with the dielectric oxide layer possesses at least any one of a lower oxidizability and a lower diffusability than the top electrode layer, there could be prevented at least any one of an oxidation of an interface of the intervening conductive layer with the dielectric oxide layer and a diffusion of a material of the intervening conductive layer into the dielectric oxide layer. This prevention of at least any one of the oxidation and the diffusion contributes to prevent deteriorations of capacitance characteristics particularly prevent an increase in the density of leak current across the interface between the intervening conductive layer and the dielectric layer. Thus, the above novel top electrode structure allows the novel thin film capacitor to suppress the leak current density lower than the conventional thin film capacitor. Namely, the above novel top electrode structure allows the interface between the intervening conductive layer and the dielectric oxide layer to be free from influences of a high temperature heat treatment to be carried out after the intervening and top electrode layers have been formed. So long as the thin film capacitor has the above multi-layer structure on the dielectric oxide layer, then the thin film capacitor is free from the deterioration of the current leakage characteristic due to the high temperature heat treatment to be cared out after the intervening and top electrode layers have been formed.

It is preferable that the intervening conductive layer processes both the lower oxidizability and the lower diffusability than the top electrode layer. Since the intervening conductive layer in contact with the dielectric oxide layer possesses both the lower oxidizability and the lower diffusability than the top electrode layer, there could surely be prevented both the oxidation of the interface of the intervening conductive layer with the dielectric oxide layer and the diffusion of the material of the intervening conductive layer into the dielectric oxide layer The prevention of both the oxidation and the diffusion more strongly and effectively contributes to prevent deteriorations of capacitance characteristics particularly prevent an increase in the density of leak current across the interface between the intervening conductive layer and the dielectric layer. Thus, the above novel top electrode structure allows the novel thin film capacitor to suppress the leak current density lower than the conventional thin film capacitor. Namely, the above novel top electrode structure allows the interface between the intervening conductive layer and the dielectric oxide layer to be free from influences of a high temperature heat treatment to be carried out after the intervening and top electrode layers have been formed. So long as the thin film capacitor has the above multi-layer structure on the dielectric oxide layer, then the thin film capacitor is free from the deterioration of the current leakage characteristic due to the high temperature heat treatment to be carried out after the intervening and top electrode layers have been formed.

It is further preferable that the intervening conductive layer includes at least any one of Pt, Au, Ag, Pd, Ni, Co and alloys thereof. When Pt is used for the first conductive layer, then the Pt first conductive layer is thin or not thick whilst the second conductive layer is made of a different conductive material than Pt, for which reason the thin film capacitor is free from the problem with the soft error. Further, it is preferable to use Pt for the first conductive film in light of the prevention of both the oxidation of the interface of the first conductive layer with the dielectric oxide layer and the diffusion of Pt into the dielectric oxide layer.

It is also preferable that the top electrode layer possesses a higher formability than the intervening conductive layer. The term "formability" means a degree of easiness of forming or shaping the layer. High formability means a high degree of easiness of forming or shaping the layer, whilst low formability means a low degree of easiness of forming or shaping the layer. When the intervening conductive film is made of a low formability material such as Pt in light of the prevention of both the oxidation of the interface of the intervening conductive layer with the dielectric oxide layer and the diffusion of Pt into the dielectric oxide layer, the top electrode layer is made of a conductive material of a high formability for compensation to the low formability of the intervening conductive layer. This allows a further substantive scaling down of the thin film capacitor with a high accurate dimension. This further substantive scaling down of the thin film capacitor allows an increase in density of integration of the semiconductor devices and integrated circuits.

It is further preferable that the top electrode layer possesses a higher formability to a reactive ion etching than the intervening conductive layer. When the intervening conductive film is made of a low formability material such as Pt in light of the prevention of both the oxidation of the interface of the intervening conductive layer with the dielectric oxide layer and the diffusion of Pt into the dielectric oxide layer, the top electrode layer is made of a conductive material of a high formability for compensation to the low formability of the intervening conductive layer. This allows a further substantive scaling down of the tin film capacitor with a high accurate dimension to be defined by the reactive ion etching. This further substantive scaling down of the thin film capacitor allows an increase in density of integration of the semiconductor devices and integrated circuits.

It is further more preferable that the top electrode layer includes at least any one of Ru, $RuO_2$, Ir, $IrO_2$, and alloys thereof because those materials have high formability to the reactive ion etching. This allows a further substantive scaling down of the thin film capacitor with a high accurate dimension to be defined by the reactive ion etching. This further substantive scaling down of the thin film capacitor allows an increase in density of integration of the semiconductor devices and integrated circuits.

It is also preferable that the dielectric oxide layer comprises a high dielectric oxide layer.

It is further preferably that the high dielectric oxide layer consists essentially of $(Ba, Sr)TiO_3$.

It is also preferable that the intervening conductive layer has a thickness in the range of one-tenth to one-twentieth of a thickness of the top electrode layer. Namely, it is preferable that the intervening conductive layer is much thinner than the top electrode layer. When the thinner intervening conductive film is made of a low formability material such as Pt in light of the prevention of both the oxidation of the interface of the intervening conductive layer with the dielectric oxide layer and the diffusion of Pt into the dielectric oxide layer, the thicker top electrode layer is made of a conductive material of a high formability for sufficient compensation to the low formability of the intervening conductive layer. This allows a further substantive scaling down of the thin film capacitor with a high accurate dimension to be defined by the reactive ion etching. This further substantive scaling down of the thin film capacitor allows an increase in density of integration of the semiconductor devices and integrated circuits. Further, when Pt is used for the intervening conductive layer, then the Pt intervening conductive layer is much thinner than the top electrode film whilst the top electrode layer is made of a different conductive material than Pt, for which reason the much thinner film capacitor is free from the problem with the soft error. Further, it is preferable to use Pt for the intervening conductive film in light of the prevention of both the oxidation of the interface of the intervening conductive layer with the dielectric oxide layer and the diffusion of Pt into the dielectric oxide layer. Moreover, since the much thinner thickness of the intervening conductive layer in contact with the dielectric oxide layer is sufficient for showing both the sufficient low oxidizability and diffusability for surely preventing both the oxidation of the interface of the intervening conductive layer with the dielectric oxide layer and the diffusion of the material of the intervening conductive layer into the dielectric oxide layer. The prevention of both the oxidation and the diffusion more strongly and effectively contributes to prevent deteriorations of capacitance characteristics particularly prevent an increase in the density of leak current across the interface between the intervening conductive layer and the dielectric layer. Thus, the above novel top electrode structure allows the novel thin film capacitor to suppress the leak current density lower than the conventional thin film capacitor. Namely, the above novel top electrode structure allows the interface between the intervening conductive layer and the dielectric oxide layer to be free from influences of a high temperature heat treatment to be carried out after the intervening and top electrode layers have been formed. So long as the thin film capacitor has the above multi-layer structure on the dielectric oxide layer, then the thin film capacitor is free from the deterioration of the current leakage characteristic due to the high temperature heat treatment to be carried out after the intervening and top electrode layers have been formed.

It is also preferable that the intervening conductive layer has a single-layered structure.

It is also preferable that the intervening conductive layer has a plural-layered structure.

It is also preferable that the top electrode layer has a single-layered structure.

It is also preferable that the top electrode layer has a plural-layered structure.

It is also preferable that a density of a leak current of the thin film capacitor is suppressed at not higher than $1 \times 10^{-4}$ $A/cm^2$ upon applying a voltage of 2V to the thin film capacitor.

The third aspect of the present invention provides a method of forming a top electrode on a high dielectric oxide layer of a thin film capacitor. The method comprises the steps of: depositing a first conductive layer on the high dielectric oxide layer; depositing a second conductive layer on the first conductive layer, wherein the first conductive layer processes at least any one of a lower oxidizability and a lower diffusability than the second conductive layer.

Since the first conductive layer in contact with the dielectric oxide layer possesses at least any one of a lower oxidizability and a lower diffusability than the second conductive layer, there could be prevented at least any one of an oxidation, of an interface of the first conductive layer with the dielectric oxide layer and a diffusion of a material of the first conductive layer into the dielectric oxide layer. This prevention of at least any one of the oxidation and the diffusion contributes to prevent deteriorations of capacitance characteristics particularly prevent an increase in the density of leak current across the interface between the first conductive layer and the dielectric layer. Thus, the above novel top electrode structure allows the novel thin film capacitor to suppress the leak current density lower than the conventional thin film capacitor. Namely, the above novel top electrode structure allows the interface between the first conductive layer and the dielectric oxide layer to be free from influences of a high temperature beat treatment to be carried out after the first and second conductive layers have been formed. So long as the thin film capacitor has the above multi-layer structure on the dielectric oxide layer, then the thin film capacitor is free from the deterioration of the current leakage characteristic due to the high temperature heat treatment to be carried out after the first and second conductive layers have been formed.

It is preferable that the first conductive layer is deposited at a first deposition rate and the second conductive layer is deposited at a second deposition rate which is higher than the first deposition rate, so that the adhesiveness of the first conductive layer with the dielectric oxide layer could be improved whilst the second conductive layer could be deposited at a higher deposition rate to improve the throughput. The improvement in the adhesiveness of the first conductive layer with the dielectric oxide layer reduces probability of peeling the films whereby the reliability and yield of the thin film capacitor could be improved. Further, the second deposition at the higher deposition rate of the second conductive layer contributes to improve the throughput. Namely, the depositions of the first and second conductive layers at the different deposition rates could improve not only the throughput but also both the reliability and yield of the thin film capacitor.

It is also preferable that the first conductive layer is deposited at the first deposition rate by a first sputtering process with applying a target with a first power and then the second conductive layer is deposited at the second deposition rate by a second sputtering process with applying the target with a second power which is higher than the first power, so that the adhesiveness of the first conductive layer with the dielectric oxide layer could be improved whilst the second conductive layer could be deposited at a higher deposition rate to improve the throughput. The improvement in the adhesiveness of the first conductive layer with the dielectric oxide layer reduces probability of peeling the films whereby the reliability and yield of the thin film capacitor could be improved. Further, the second deposition at the higher deposition rate of the second conductive layer contributes to improve the throughput Namely, the depositions of the first and second conductive layers at the different deposition rates could improve not only the throughput but also both the reliability and yield of the thin film capacitor.

It is also preferable that the first power for the first sputtering process is not higher than 5.1 W/cm$^2$, so that the low deposition rate of the first conductive layer on the dielectric oxide layer could improve the adhesiveness between the first conductive layer and the dielectric oxide layer and also improve the interface state between the first conductive layer and the dielectric oxide layer.

It is further preferable that the first power for the first sputtering process is not higher than 1.7 W/cm$^2$, so that the lower deposition rate of the first conductive layer on the dielectric oxide layer could further improve the adhesiveness between the first conductive layer and the dielectric oxide layer and also further improve the interface state between the first conductive layer and the dielectric oxide layer.

It is further more preferable that the first power for the first sputtering process is not higher than 0.6 W/cm$^2$, so that the further lower deposition rate of the first conductive layer on the dielectric oxide layer could furthermore improve the adhesiveness between the first conductive layer and the dielectric oxide layer and also furthermore improve the interface state between the first conductive layer and the dielectric oxide layer.

It is also preferable that the first and second conductive layers are deposited by first and second chemical vapor deposition processes.

It is also preferable that the first and second conductive layers are deposited by first and second evaporation processes.

It is also preferable that the first conductive layer processes both the lower oxidizability and the lower diffusability than the second conductive layer. Since the first conductive layer in contact with the dielectric oxide layer possesses both the lower oxidizability and the lower diffusability than the second conductive layer, there could surely be prevented both the oxidation of the interface of the first conductive layer with the dielectric oxide layer and the diffusion of the material of the first conductive layer into the dielectric oxide layer. The prevention of both the oxidation and the diffusion more strongly and effectively contributes to prevent deteriorations of capacitance characteristics particularly prevent an increase in the density of leak current across the interface between the first conductive layer and the dielectric layer. Thus, the above novel top electrode structure allows the novel thin film capacitor to suppress the leak current density lower than the conventional thin film capacitor. Namely, the above novel top electrode structure allows the interface between the first conductive layer and the dielectric oxide layer to be free from influences of a high temperature heat treatment to be carried out after the first and second conductive layers have been formed So long as the thin film capacitor has the above multi-layer structure on the dielectric oxide layer, then the thin film capacitor is free from the deterioration of the current leakage characteristic due to the high temperature heat treatment to be carried out after the first and second conductive layers have been formed.

It is further preferable that the first conductive layer includes at least any one of Pt, Au, Ag, Pd, Ni, Co and alloys thereof. When Pt is used for the first conductive layer, then the Pt first conductive layer is thin or not thick whilst the second conductive layer is made of a different conductive material than Pt, for which reason the thin film capacitor is free from the problem with the soft error. Further, it is preferable to use Pt for the first conductive film in light of the prevention of both the oxidation of the interface of the first conductive layer with the dielectric oxide layer and the diffusion of Pt into the dielectric oxide layer.

It is also preferable that the second conductive layer possesses a higher formability to a reactive ion etching than the first conductive layer. Even the first conductive film is made of a low formability material such as Pt in light of the prevention of both the oxidation of the interface of the first conductive layer with the dielectric oxide layer and the diffusion of Pt into the dielectric oxide layer, the second conductive layer is made of a conductive material of a high formability for compensation to the low formability of the first conductive layer. This allows a further substantive scaling down of the thin film capacitor with a high accurate dimension to be defined by the reactive ion etching This further substantive scaling down of the thin film capacitor allows an increase in density of integration of the semiconductor devices aid integrated circuits.

It is further preferable that the second conductive layer includes at least any one of Ru, $RuO_2$, Ir, $IrO_2$, and alloys thereof because those materials have high formability to the reactive ion etching. This allows a further substantive scaling down of the thin film capacitor with a high accurate dimension to be defined by the reactive ion etching. This further substantive scaling down of the thin film capacitor allows an increase in density of integration of the semiconductor devices and integrated circuits.

It is also preferable that the high dielectric oxide layer consists essentially of (Ba, Sr)TiO$_3$.

It is also preferable that the first conductive layer has a thickness in the range of one-tenth to one-twentieth of a thickness of the second conductive layer. Namely, it is preferable that the first conductive layer is much thinner than the second conductive layer. Even the thinner first conductive film is made of a low formability material such as Pt in light of the pretension of both the oxidation of the interface of the first conductive layer with the dielectric oxide layer and the diffusion of Pt into the dielectric oxide layer, the thicker second conductive layer is made of a conductive material of a high formability for sufficient compensation to the low formability of the first conductive layer. This allows a further substantive scaling down of the thin film capacitor with a high accurate dimension to be defined by the reactive ion etching. This further substantive scaling down of the thin film capacitor allows an increase in density of integration of the semiconductor devices and integrated circuits. Further, even Pt is used for the first conductive layer, then the Pt first conductive layer is much thinner than the second conductive film whilst the second conductive layer is made of a different conductive material than Pt, for which reason the much thinner film capacitor is free from the problem with the soft error. Further, it is preferable to use Pt for the first conductive film in light of the pretension of both the oxidation of the interface of the first conductive layer with the dielectric oxide layer and the diffusion of Pt into the dielectric oxide layer. Moreover, since the much thinner thickness of the first conductive layer in contact with the dielectric oxide layer is sufficient for showing both the sufficient low oxidizability and diffusability for surely preventing both the oxidation of the interface of the first conductive layer with the dielectric oxide layer and the diffusion of the material of the first conductive layer into the dielectric oxide layer. The prevention of both the oxidation and the diffusion more strongly and effectively contributes to prevent deteriorations of capacitance characteristics particularly prevent an increase in the density of leak current across the interface between the first conductive layer and the dielectric layer. Thus, the above novel top electrode structure allows the novel thin film capacitor to suppress the leak current density lower than the conventional thin film capacitor. Namely, the above novel top electrode structure allows the interface between the first conductive layer and the dielectric oxide layer to be free from influences of a high temperature heat treatment to be carried out after the first and second conductive layers have been formed. So long as the thin film capacitor has the above multi-layer structure on the dielectric oxide layer, then the thin film capacitor is free from the deterioration of the current leakage characteristic due to the high temperature heat treatment to be carried out after the first and second conductive layers have been formed.

FIG. 1 is a fragmentary across sectional elevation view illustrative of a novel thin film capacitor with an improved top electrode in accordance with the present invention. A novel thin film capacitor 1 has the following structure. A bottom electrode layer 102 is provided on a semiconductor substrate 101. A high dielectric oxide layer 103 is provided on the bottom electrode layer 102. A top electrode 105 is provided on the high dielectric oxide layer 103. The top electrode 105 further comprises a first conductive layer 104 on the high dielectric oxide layer 103 and a second conductive layer 107 on the first conductive layer 104.

The first conductive layer 104 possesses at least any one of a lower oxidizability and a lower diffusability than the second conductive layer 107. Since the first conductive layer 104 in contact with the high dielectric oxide layer 103 possesses at least any one of a lower oxidizability and a lower diffusability than the second conductive layer 107, there could be prevented at least any one of an oxidation of an interface of the fist conductive layer 104 with the high dielectric oxide layer 103 and a diffusion of a material of the first conductive layer 104 into the high dielectric oxide layer 103. This prevention of at least any one of the oxidation and the diffusion contributes to prevent deteriorations of capacitance characteristics, particularly preventing an increase in the density of leak current across the interface between the first conductive layer 104 and the dielectric layer Thus, the above novel top electrode structure allows the novel thin film capacitor 1 to suppress the leak current density lower than the conventional thin film capacitor 1. Namely, the above novel top electrode structure allows the interface between the first conductive layer 104 and the high dielectric oxide layer 103 to be free from influences of a high temperature heat treatment to be carried out after the first and second conductive layers 104 and 107 have been formed. So long as the thin film capacitor 1 has the above multi-layer structure on the high dielectric oxide layer 103, then the thin film capacitor 1 is free from the deterioration of the current leakage characteristic due to the high temperature beat treatment to be carried out after the first and second conductive layers 104 and 107 have been formed.

It is also preferable that the first conductive layer 104 possesses both the lower oxidizability and the lower diffusability than the second conductive layer 107. Since the first conductive layer 104 in contact with the high dielectric oxide layer 103 possesses both the lower oxidizability and the lower diffusability than the second conductive layer 107, there could surely be prevented both the oxidation of the interface of the first conductive layer 104 with the high dielectric oxide layer 103 and the diffusion of the material of the first conductive layer 104 into the high dielectric oxide layer 103. The prevention of both the oxidation and the diffusion more strongly and effectively contributes to prevent deteriorations of capacitance characteristics, particularly preventing an increase in the density of leak current across the interface between the first conductive layer 104 and the dielectric layer. Thus, the above novel top electrode structure allows the novel thin film capacitor 1 to suppress the leak current density lower than the conventional thin film capacitor 1. Namely, the above novel top electrode structure allows the interface between the first conductive layer 104 and the high dielectric oxide layer 103 to be free from influences of a high temperature heat treatment, for example, 350° C. to be carried out after the first and second conductive layers 104 and 107 have been formed. So long as the thin film capacitor 1 has the above multi-layer structure on the high dielectric oxide layer 103, then the thin film capacitor 1 is free from the deterioration of the current leakage characteristic due to the high temperature heat treatment to be carried out after the first and second conductive layers 104 and 107 have been formed.

It is further preferable that the first conductive layer 104 includes at least any one of Pt, Au, Ag, Pd, Ni, Co and alloys thereof. When Pt is used for the first conductive layer 104, then the Pt first conductive layer 104 is thin or not thick whilst the second conductive layer 107 is made of a different conductive material than Pt, for which reason the thin film capacitor 1 is free from the problem with the soft error with alpha-ray. Further, it is preferable to use Pt for the first conductive film in light of the prevention of both the oxidation of the interface of the first conductive layer 104 with the high dielectric oxide layer 103 and the diffusion of Pt into the high dielectric oxide layer 103.

It is also preferable that the second conductive layer 107 possesses a higher formability to a reactive ion etching than the first conductive layer 104. Even the first conductive film is made of a low formability material such as Pt in light of the pretension of both the oxidation of the interface of the first conductive layer 104 with the high dielectric oxide layer 103 and the diffusion of Pt into the high dielectric oxide layer 103, the second conductive layer 107 is made of a conductive material of a high formability for compensation to the low formability of the first conductive layer 104. This allows a further substantive scaling down of the thin film capacitor 1 with a high accurate dimension to be defined by the reactive ion etching. This further substantive scaling down of the thin film capacitor 1 allows an increase in density of integration of the semiconductor devices and integrated circuits.

It is further preferable that the second conductive layer 107 includes at least any one of Ru, $RuO_2$, Ir, $IrO_2$, and alloys thereof because those materials have high formability to the reactive ion etching. This allows a further substantive scaling down of the thin film capacitor 1 with a high accurate dimension to be defined by the reactive ion etching. This further substantive scaling down of the thin film capacitor 1 allows an increase in density of integration of the semiconductor devices and integrated circuits.

It is also preferable that the high dielectric oxide layer 103 consists essentially of (Ba, Sir)$TiO_3$.

It is also preferable that the first conductive layer 104 has a thickness in the range of one-twentieth to one-twentieth of a thickness of the second conductive layer 107. Namely, it is preferable that the first conductive layer 104 is much thinner than the second conductive layer 107. Even the thinner first conductive film is made of a low formability material such as Pt in light of the prevention of both the oxidation of the interface of the first conductive layer 104 with the high dielectric oxide layer 103 and the diffusion of Pt into the high dielectric oxide layer 103, the thicker second conductive layer 107 is made of a conductive material of a high formability for sufficient compensation to the low formability of the first conductive layer 104. This allows a further substantive scaling down of the thin film capacitor 1 with a high accurate dimension to be defined by the reactive ion etching. This further substantive scaling down of the thin film capacitor 1 allows an increase in density of integration of the semiconductor devices and integrated circuits. Further, when Pt is used for the first conductive layer 104, then the Pt first conductive layer 104 is much thinner than the second conductive film whilst the second conductive layer 107 is made of a different conductive material than Pt, for which reason the much thinner film capacitor 1 is free from the problem with the soft error. Further, it is preferable to use Pt for the first conductive film in light of the prevention of both the oxidation of the interface of the first conductive layer 104 with the high dielectric oxide layer 103 and the diffusion of Pt into the high dielectric oxide layer 103. Moreover, since the much thinner thickness of the first conductive layer 104 in contact with the high dielectric oxide layer 103 is sufficient for showing both the sufficient low oxidizability and diffusability for surely preventing both the oxidation of the interface of the first conductive layer 104 with the high dielectric oxide layer 103 and the diffusion of the material of the first conductive layer 104 into the high dielectric oxide layer 103. The prevention of both the oxidation and the diffusion more strongly and effectively contributes to prevent deteriorations of capacitance characteristics, particularly preventing an increase in the density of leak current across the interface between the first conductive layer 104 and the dielectric layer. Thus, the above novel top electrode structure allows the novel thin film capacitor 1 to suppress the leak current density lower than the conventional thin film capacitor 1. Namely, the above novel top electrode structure allows the interface between the first conductive layer 104 and the high dielectric oxide layer 103 to be free from influence of a high temperature heat treatment to be carried out after the first and second conductive layers 104 and 107 have been formed. So long as the thin film capacitor 1 has the above multi-layer structure on the high dielectric oxide layer 103, then the thin film capacitor 1 is free from the deterioration of the current leakage characteristic due to the high temperature heat treatment to be carried out after the first and second conductive layers 104 and 107 have been formed.

The above novel thin film capacitor 1 with the improved top electrode 105 may be fabricated as follows. The bottom electrode 102 is deposited on the semiconductor substrate 101. The high dielectric oxide layer 103 is deposited on the bottom electrode 102. The top electrode 105 is then deposited on the high dielectric oxide layer 103. The first conductive layer 104 may be deposited by any one of a sputtering method, a chemical vapor deposition method and an evaporation method. The second conductive layer 107 may also be deposited by the same method as the first conductive layer 104 but under different deposition conditions from the first conductive layer 104. Deposition conditions are, for example, substrate temperature, selections of the materials for the first and second conductive layers 104 and 107, individual thicknesses of the first and second conductive layers 104 and 107, individual deposition rates, deposition temperatures, sputter voltages to be applied to a target, gas pressures and the deposition methods. In case of the sputtering method, the sputter voltage to be applied to the target is most important in the deposition conditions.

When the first conductive layer 104 is made of Pt which has a low formability and is capable of irradiation of alpha-ray which may cause soft error whilst the second conductive layer 107 is made of Ru which has a high formability and is incapable of irradiation of alpha-ray, for which reason it is preferable that th. Pt first conductive layer 104 is as thinner than the Ru second conductive layer 107 as possible.

Further, even if the target is sputtered with a high energy for deposition of the first conductive layer 104 on the high dielectric oxide layer 103, then the high dielectric oxide layer 103 may receive substantive damages. In light of prevention of the high dielectric oxide layer 103 from any substantive damage of the sputtering for deposition of the first conductive layer 104, it is required to carry out the first deposition for the first conductive layer 104 at an energy as lower as possible. Namely, the first conductive layer 104 is deposited at a first deposition rate and the second conductive layer 107 is deposited at a second deposition rate which is higher than the first deposition rate, so that the adhesiveness of the first conductive layer 104 with the high dielectric oxide layer 103 could be improved whilst the second conductive layer 107 could be deposited at a higher deposition rate to improve the throughput The improvement in the adhesiveness of the first conductive layer 104 with the high dielectric oxide layer 103 reduces probability of peeling the films whereby the reliability and yield of the thin film capacitor 1 could be improved. Further, the second deposition at the higher deposition rate of the second conductive layer 107 contributes to improve the throughput. Namely, the depositions of the first and second conductive layers 104 and 107 at the different deposition rates could improve not only the throughput but also both the reliability and yield of the thin film capacitor 1. For example, it is preferable that the first power for the first sputtering process is not higher than 5.1 W/cm$^2$, so that the low deposition rate of the first conductive layer on the dielectric oxide layer could improve the adhesiveness between the first conductive layer and the dielectric oxide layer and also improve the interface state between the first conductive layer and the dielectric oxide layer. If, however, the first power is beyond 5.1 W/cm$^2$, the novel thin film capacitor shows a similar current leakage characteristic than the prior art thin film capacitor after the heat treatment. For example, Pt is deposited by DC sputtering at a deposition rate of 36 nanometers/min. to form a Pt layer with a thickness of 5 nanometers as the first conductive layer before Ru is then deposited by DC sputtering at a deposition rate of 21 nanometers/min. to form an Ru layer with a thickness of 50 nanometers as the second conductive layer. The first deposition rate for depositing the first conductive layer 104 is higher than the second deposition rate for depositing the second conductive layer 107. Notwithstanding, it is possible to modify the first and second deposition rates so that the first deposition rate for depositing the first conductive layer 104 is lower than the second deposition rate for depositing the second conductive layer 107.

It is further preferable that the first power for the first sputtering process is not higher than 17 W/cm$^2$, so that the lower deposition rate of the first conductive layer on the dielectric oxide layer could further improve the adhesiveness between the first conductive layer and the dielectric oxide layer and also further improve the interface state between the first conductive layer and the dielectric oxide layer. It is further more preferable that the first power for the first sputtering process is not higher than 0.6 W/cm$^2$, so that the further lower deposition rate of the first conductive layer on the dielectric oxide layer could furthermore improve the adhesiveness between the first conductive layer and the dielectric oxide layer and also furthermore improve the interface state between the first conductive layer and the dielectric oxide layer.

The deposition rate can be controlled by control of the voltage or power applied to the target of the sputtering process.

Consequently, it is important that the first conductive layer 104 possesses at least any one of a lower oxidizability and a lower diffusability than the second conductive layer 107 and also that the first conductive layer 104 is deposited on the high dielectric oxide layer 103 with a possible low energy.

Figure 3:
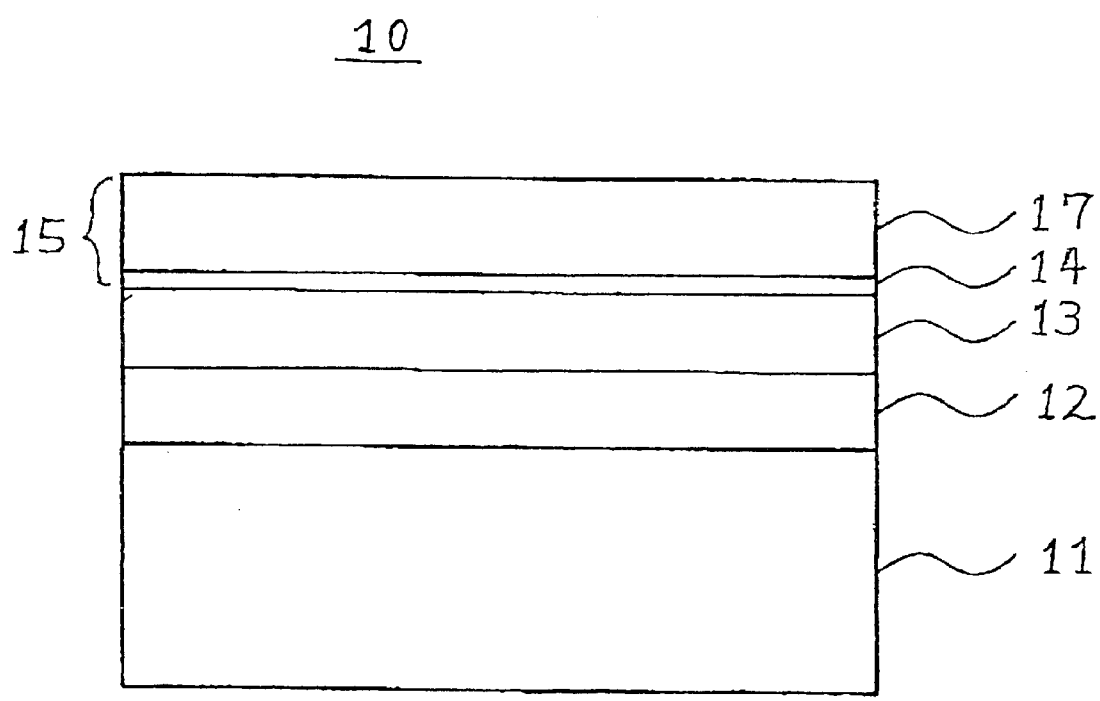
FIG. 3 is a fragmentary cross sectional elevation view illustrative of a novel thin film capacitor with an improved top electrode structure in a first embodiment in accordance with the present invention.

A first aspect of the embodiment according to the present invention will be described in detail with reference to FIG. 3 which is a fragmentary cross sectional elevation view illustrative of a novel thin film capacitor with an improved top electrode structure.

An n-type silicon substrate 11 having a resistivity of 0.1 Ωcm was prepared. A bottom electrode 12 of RuO$_2$ having a thickness of 200 nanometers was deposited on the silicon substrate 11 by a first DC sputtering method. An electron cyclotron resonance chemical vapor deposition method was carried out by use of Ba(DPM)$_2$, Sr(DPM)$_2$, Ti(i-OC$_3$H$_7$) and oxygen gases under conditions of a substrate temperature of 500° C. a gas pressure of 7 mTorr, and a plasma excitation microwave power of 500 W, thereby depositing a (Ba, Sr)TiO$_3$ high dielectric oxide layer 13 with a thickness of 30 nanometers on the bottom electrode 12.

A second DC sputtering method was carried out under deposition conditions of a deposition temperature of 25° C., a gas pressure of 4 mTorr, and a DC power of 5.1 W/cm$^2$, and a deposition rate of 36 nanometers/min. thereby depositing a Pt first conductive layer 14 with a thickness of 5 nanometers on the (Ba, Sr)TiO$_3$ high dielectric oxide layer 13.

A third DC sputtering method was then carried out under deposition conditions of a deposition temperature of 25° C., a gas pressure of 4 mTorr, and a DC power of 4.5 W/cm$^2$, and a deposition rate of 21 nanometers/min. thereby depositing an Ru second conductive layer 17 with a thickness of 50 nanometers on the Pt first conductive layer 14. As a result, the novel thin film capacitor seas completed.

Thereafter, the novel thin film capacitor was placed in oxygen and nitrogen gases at a temperature of 500° C. for 30 minutes.

Figure 2:
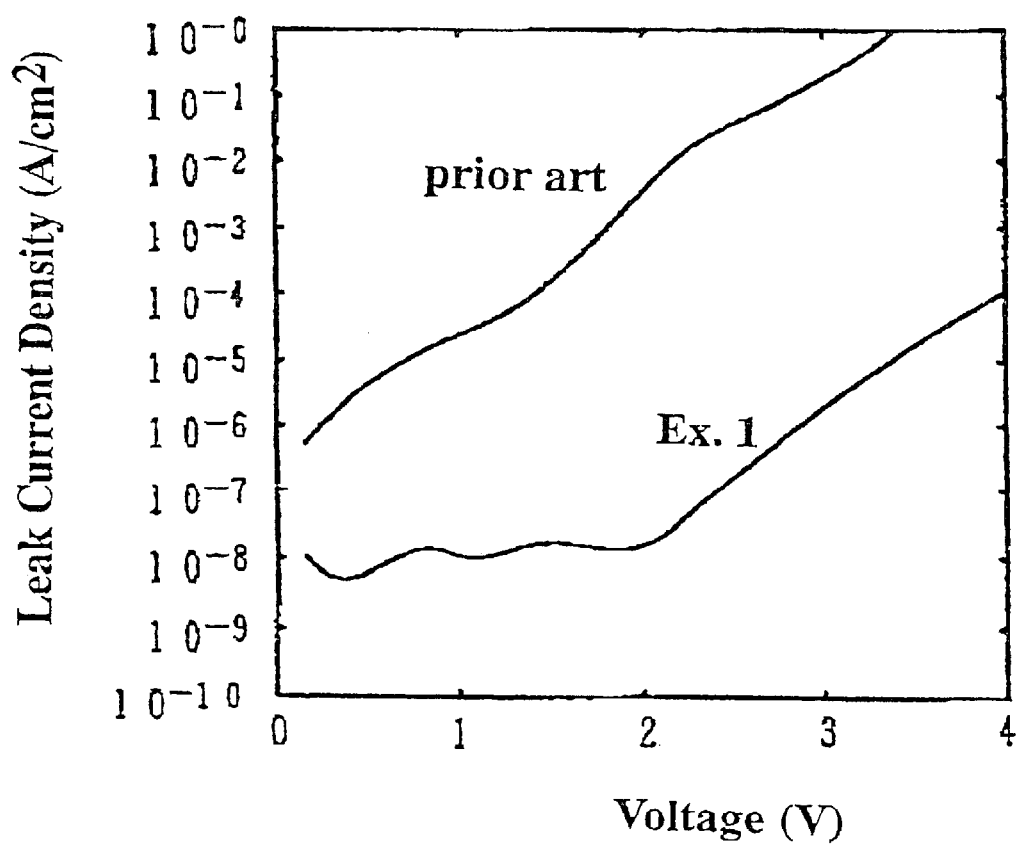
FIG. 2 is a diagram illustrative of variations in density of leak current of the novel thin film capacitor with the improved Pt/Ru double-layered structure and the conventional thin film with the Ru single-layered structure.

As a comparative embodiment, the conventional thin film capacitor having the single layered Ru top electrode was prepared before the conventional thin film capacitor was also placed in oxygen and nitrogen gases at a temperature of 500° C. for 30 minutes. FIG. 2 is a diagram illustrative of variations in density of leak current of the novel thin film capacitor with the improved Pt/Ru double-layered structure and the conventional thin film with the Ru single-layered structure. It was shown that the first deposition rate for depositing the Pt first conductive layer 14 is not necessarily higher than the second deposition rate for depositing the Ru second conductive layer 17.

FIG. 2 apparently shows that when the prior art was applied, then the current leakage characteristics of the conventional thin film capacitor are not good, for example, a leak current density of not less than 1×10$^{-6}$ A/cm$^2$ upon zero driving voltage application to the thin film capacitor. Upon increase in the driving voltage to the thin film capacitor, the thin film capacitor shows a simple increase in the leak current density In contrast to the conventional thin film capacitor, the novel thin film capacitor with the improved double-layered top electrode shows good current leakage characteristics, for example, a low leak current density of not less than 1×10$^{-8}$ A/cm$^2$ upon zero driving voltage application to the thin film capacitor. Upon increase in the driving voltage from 0V to about 2V, the above low leak current density almost remains unchanged. For example, under the application of the driving voltage of 2V to the novel thin film capacitor, the leak current density remains not less than 1×10$^{-8}$ A/cm$^2$. Namely, the novel thin film capacitor shows the stable and good leak characteristics.

The adhesiveness of the Pt first conductive layer 14 to the (Ba, Sr)TiO$_3$ high dielectric oxide layer 13 was evaluated by varying the thickness of the Pt first conductive layer 14 in the range of 5–20 nanometers. It was confirmed that as the thickness of the Pt first conductive layer 14 is reduced, the adhesiveness of the Pt first conductive layer 14 to the (Ba, Sr)TiO$_3$ high dielectric oxide layer 13 is improved. For example, a preferable thickness range of the Pt first conductive layer 14 is not thicker than 10 nanometers.

Figure 4:
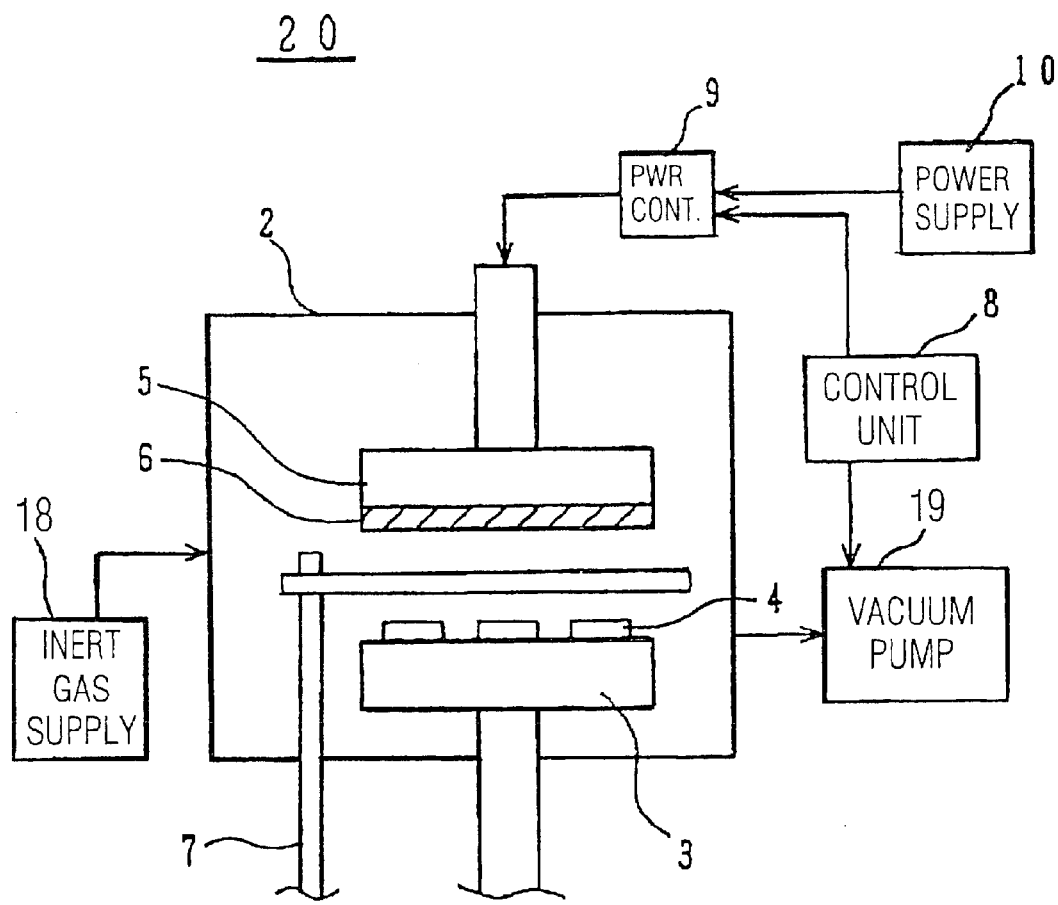
FIG. 4 is a block diagram illustrative of a structure of a sputtering system as one example of the available sputtering systems for depositing the electrodes of the novel thin film capacitor.

Available sputtering systems for depositing the electrodes of the novel thin film capacitor are not limited to a specific one. FIG. 4 is a block diagram illustrative of a structure of a sputtering system as one example of the available sputtering systems for depositing the electrodes of the novel thin film capacitor. The sputtering system 20 has a vacuum chamber 2 which accommodates a substrate holder 3 on which substrates 4 are mounted for forming a novel thin film capacitor. The vacuum chamber 2 also accommodates a high frequency electrode plate 5 with a sputter target 6 which faces to the substrates 4 on the substrate holder 3 and is distanced from the substrates 4 on the substrate holder 3. It is of course possible to provide the high frequency electrode plate 5 with plural different sputter targets 6. It is alternatively possible to provide a plurality of the high frequency electrode plate 5 so that different targets 6 are provided on the plural high frequency electrode plates 5 A shutter 7 may optionally be provided between the substrate holder 3 and the high frequency electrode plate 5. An inert gas supplier 18 is further provided for supplying an inert gas into the vacuum chamber 2. A vacuum pump 19 is also provided for causing a vacuum of the vacuum chamber 2. A high frequency power supply 10 and a power controller 9 are provided for supplying a high frequency power through the power controller 9 to the high frequency electrode plate 5 under control of the power, whereby the power controller 9 controls the power to be applied to the target 6 on the high frequency electrode plate 5. Since the deposition rate depends on a voltage corresponding to the power to be applied to the target 6, then the power controller 9 controls the deposition rate. A control unit 8 is further provided which is connected to both the vacuum pump 19 and the power controller 9 for controlling the deposition time of sputtering process and a degree of the vacuum in the vacuum chamber 2.

The above novel thin film capacitor with the improved double-layered top electrode structure possesses the following advantages and effects.

First, the above novel thin film capacitor has the good electric characteristics. The material of the first conductive layer in contact with the high dielectric oxide layer is so selected as to have a low oxidizability and a low diffusability into the high dielectric oxide layer, whereby it is possible to prevent a reaction such as oxidation on an interface between the first conductive layer and the high dielectric oxide layer as well as prevent the high dielectric oxide layer from receipt of any substantive damage.

Second, the double-layered top electrode structure makes it possible to shorten the time for deposition of the top electrode for improvement in throughput of the thin film capacitor. The first conductive layer is deposited at a sufficiently low deposition rate for prevent the top surface of the high dielectric oxide layer from receiving any substantive damage, whilst the second conductive layer is deposited at a sufficiently high deposition rate for shortening a total time for depositions of the first and second conductive layers.

Third, the first conductive layer intervening between the second conductive layer an the high dielectric oxide layer prevents peeling of the top electrode from the high dielectric oxide layer for improvement in the yield of the thin film capacitor.

Fourth, the material of the second conductive layer is so selected as to have a high formability to a reactive ion etching, whilst the first conductive layer made of a material with a low formability is formed much thinner than the second conductive layer. The improvement in formability of the top electrode allows a further scaling down of the thin film capacitor with a highly accurate dimension, whereby a further increase in the degree of integration of the semiconductor devices can be realized.

The following descriptions will focus on possible modification to the above present invention. In this embodiment, the bottom electrode is made of $RuO_2$. Notwithstanding, conductive materials are available for the bottom electrode, which are capable of keeping conductivity in an oxygen atmosphere during the process for formation of the high dielectric oxide layer on the bottom electrode. For example, there are available for the bottom electrode material Ru, Ir, Re, Os, Rh, and oxides thereof as well as at least any one selected from the group of silicide compounds in addition at least any one selected from the group of Pt, Au, Ag, Pd, Ni, Co and alloys thereof.

Further, the bottom electrode may be modified to have multi-layer structure.

In place of $(Ba, Sr)TiO_3$, materials represented by a chemical formula $ABO_3$ are available for the high dielectric oxide layer, wherein A may comprise at least any one selected from the group consisting of Ba, Sr, Pb, Ca, La, Li and K, and B may comprise at least any one selected from the group consisting of Ti, Zr, Ta, Nb, Mg, Fe, Zn and W. For example, there are available $SrTiO_3$, $(Sr, Ca)TiO_3$, $(Ba, Sr, Ca)TiO_3$, $PbTiO_3$, $Pb(Zr, Ti)O_3$, $(Pb, La)(Zr, Ti)O_3$, $Pb(Mg, Nb)O_3$, $Pb(Mg, W)O_3$, $Pb(Zn, Nb)O_3 LiTaO_3$, $LiNbO_3$, $KTaO_3$, $KTaO_3$, and $KNbO_3$. Further, there are available materials represented by the chemical formula $(Bi_2O_2)$ $(A_{m-1}B_mO_{3m+1})$ (m=1, 2, 3, 4, 5), wherein A may comprise at least any one selected from the group consisting of Ba, Sr, Pb, Ca, K and Bi, and B may comprise at least any one selected from the group consisting of Nb, Ta, Ti, and W. For example, $Ba_4Ti_3O_2$, $SrBa_2Ta_2O_9$, and $SrBa_2Nb_2O_9$ are also available. In addition, $Ta_2O_5$ is further available which has a chemical composition different from those of the above chemical formula.

The above high dielectric oxide layer may be modified to have a multi-layered structure.

Figure 5:
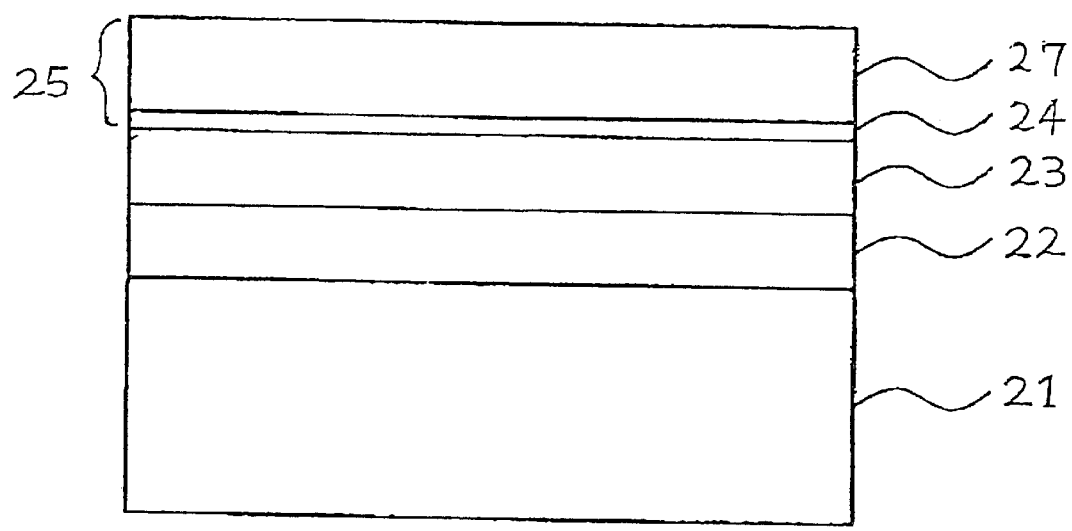
FIG. 5 is a fragmentary cross sectional elevation view illustrative of a novel thin film capacitor with an improved top electrode structure in a second embodiment in accordance with the present invention.

A second aspect of the embodiment according to the present invention will be described in detail with reference to FIG. 5 which is a fragmentary cross sectional elevation view illustrative of a novel thin film capacitor with an improved top electrode structure.

An n-type silicon substrate 21 having a resistivity of 0.1 Ωcm was prepared. A bottom electrode 22 of $RuO_2$ having a thickness of 200 nanometers was deposited on the silicon substrate 21 by a first DC sputtering method. An electron cyclotron resonance chemical vapor deposition method was carried out by use of $Ba(DPM)_2$, $Sr(DPM)_2$, $Ti(i-OC_3H_7)$ and oxygen gases under conditions of a substrate temperature of 500° C., a gas pressure of 7 mTorr, and a plasma excitation microwave power of 500 W, thereby depositing a $(Ba, Sr)TiO_3$ high dielectric oxide layer 23 with a thickness of 30 nanometers on the bottom electrode 22.

A second DC sputtering method was carried out under deposition conditions of a deposition temperature of 25° C., a gas pressure of 4 mTorr, and a DC power of 0.6 W/cm², and a deposition rate of 9 nanometers/min. thereby depositing a Pt first conductive layer 24 with a thickness of 5 nanometers on the $(Ba, Sr)TiO_3$ high dielectric oxide layer 23.

A third DC sputtering method was then carried out under deposition conditions of a deposition temperature of 25° C., a gas pressure of 4 mTorr, and a DC power of 4.5 W/cm², and a deposition rate of 21 nanometers/min. thereby depositing an Ru second conductive layer 27 with a thickness of 50 nanometers on the Pt first conductive layer 24. A,s a result, the novel thin film capacitor was completed.

Thereafter, the novel thin film capacitor was placed in oxygen and nitrogen gases at a temperature of 500° C. for 30 minutes.

It was confirmed that the novel thin film capacitor with the improved double-layered top electrode shows good current leakage characteristics illustrated in FIG. 2, for example, a low leak current density of not less than $1\times10^{-8}$ A/cm$^2$ upon zero driving voltage application to the thin film capacitor. Upon increase in the driving voltage from 0V to about 2V, the above low leak current density almost remains unchanged. For example, under the application of the driving voltage of 2V to the novel thin film capacitor, the leak current density remains not less than $1\times10^{-8}$ A/cm$^2$. Namely, the novel thin film capacitor shows the stable and good leak characteristics.

The adhesiveness of the Pt first conductive layer 24 to the (Ba, Sr)TiO$_3$ high dielectric oxide layer 23 was also evaluated by varying the thickness of the Pt first conductive layer 24 in the range of 5–20 nanometers. It was confirmed that as the thickness of the Pt first conductive layer 24 is reduced, the adhesiveness of the Pt first conductive layer 24 to the (Ba, Sr)TiO$_3$ high dielectric oxide layer 23 is improved. For example, a preferable thickness range of the Pt first conductive layer 24 is not thicker than 10 nanometers.

Further, in place of Pt first conductive layer 24, a Pt—Ru alloy first conductive layer 24 is formed to form a modified thin film capacitor. The modified thin film capacitor was placed in oxygen and nitrogen atmosphere at a temperature of 500° C. for 30 minutes.

It was also confirmed that the modified thin film capacitor shows good current leakage characteristics illustrated in FIG. 2, for example, a low leak current density of not less than $1\times10^{-8}$ A/cm$^2$ upon zero driving voltage application to the thin film capacitor. Upon increase in the driving voltage from 0V to about 2V, the above low leak current density almost remains unchanged. For example, under the application of the driving voltage of 2V to the modified thin film capacitor, the leak current density remains not less than $1\times10^{-8}$ A/cm$^2$. Namely, the modified thin film capacitor shows the stable and good leak characteristics.

The adhesiveness of the Pt—Ru alloy first conductive layer 24 to the (Ba, Sr)TiO$_3$ high dielectric oxide layer 23 was also evaluated by varying the thickness of the Pt—Ru alloy first conductive layer 24 in the range of 5–20 nanometers. It was confirmed that as the thickness of the Pt—Ru alloy first conductive layer 24 is reduced, the adhesiveness of the Pt—Ru alloy first conductive layer 24 to the (Ba, Sr)TiO$_3$ high dielectric oxide layer 23 is improved. For example, a preferable thickness range of the Pt—Ru alloy first conductive layer 24 is not thicker than 10 nanometers.

The above novel thin film capacitor with the improved double-layered top electrode structure possesses the following advantages and effects.

First, the above novel thin film capacitor has the good electric characteristics. The material of the first conductive layer in contact with the high dielectric oxide layer is so selected as to have a low oxidizability and a low diffusability into the high dielectric oxide layer, whereby it is possible to prevent a reaction such as oxidation on an interface between the first conductive layer and the high dielectric oxide layer as well as prevent the high dielectric oxide layer from receipt of any substantive damage.

Second, the double-layered top electrode structure makes it possible to shorten the time for deposition of the top electrode for improvement in throughput of the thin film capacitor. The first conductive layer is deposited at a sufficiently low deposition rate for prevent the top surface of the high dielectric oxide layer from receiving any substantive damage, whilst the second conductive layer is deposited at a sufficiently high deposition rate for shortening a total time for depositions of the first and second conductive layers.

Third, the first conductive layer intervening between the second conductive layer an the high dielectric oxide layer prevents peeling of the top electrode from the high electric oxide layer for improvement in the yield of the thin film capacitor.

Fourth, the material of the second conductive layer is so selected as to have a high formability to a reactive ion etching, whilst the first conductive layer made of a material with a low formability is formed much thinner than the second conductive layer. The improvement in formability of the top electrode allows a further scaling down of the thin film capacitor with a highly accurate dimension, whereby a further increase in the degree of integration of the semiconductor devices can be realized.

The following descriptions will focus on possible modification to the above present invention. In this embodiment, the bottom electrode is made of RuO$_2$. Notwithstanding, conductive materials are available for the bottom electrode, which are capable of keeping conductivity in an oxygen atmosphere during the process for formation of the high dielectric oxide layer on the bottom electrode. For example, there are available for the bottom electrode material Ru, Ir, Re, Os, Rh, and oxides thereof as well as at least any one selected from the group of silicide compounds in addition at least any one selected from the group of Pt, Au, Ag, Pd, Ni, Co and alloys thereof.

Further, the bottom electrode may be modified to have multi-layer structure.

In place of (Ba, Sr)TiO$_3$, materials represented by a chemical formula ABO$_3$ are available for the high dielectric oxide layer, wherein A may comprise at least any one selected from the group consisting of Ba, Sr, Pb, Ca, La, Li and K, and B may comprise at least any one selected from the group consisting of Ti, Zr, Ta, Nb, Mg, Fc, Zn and W. For example, there are available SrTiO$_3$, (Sr, Ca)TiO$_3$, (Ba, Sr, Ca)TiO$_3$, PbTiO$_3$, Pb(Zr, Ti)O$_3$, (Pb, La)(Zr, Ti)O$_3$, Pb(Mg, Nb)O$_3$, Pb(Mg, W)O$_3$, Pb(Zn, Nb)O$_3$LiTaO$_3$, LiNbO$_3$, KTaO$_3$, KTaO$_3$, and KNbO$_3$. Further, there are available materials represented by the chemical formula (Bi$_2$O$_2$)(A$_{m-1}$B$_m$O$_{3m+1}$) (m=1, 2, 3, 4, 5), wherein A may comprise at least any one selected from the group consisting of Ba, Sr, Pb, Ca, K and Bi, and B may comprise at least any one selected from the group consisting of Nb, Ta, Ti, and W. For example, Ba$_4$Ti$_3$O$_{12}$, SrBa$_2$Ta$_2$O$_9$, and SrBa$_2$Nb$_2$O$_9$ are also available. In addition, Ta$_2$O$_5$ is further available which has a chemical composition different from those of the above chemical formula.

The above high dielectric oxide layer may be modified to have a multi-layered structure.

Figure 6:
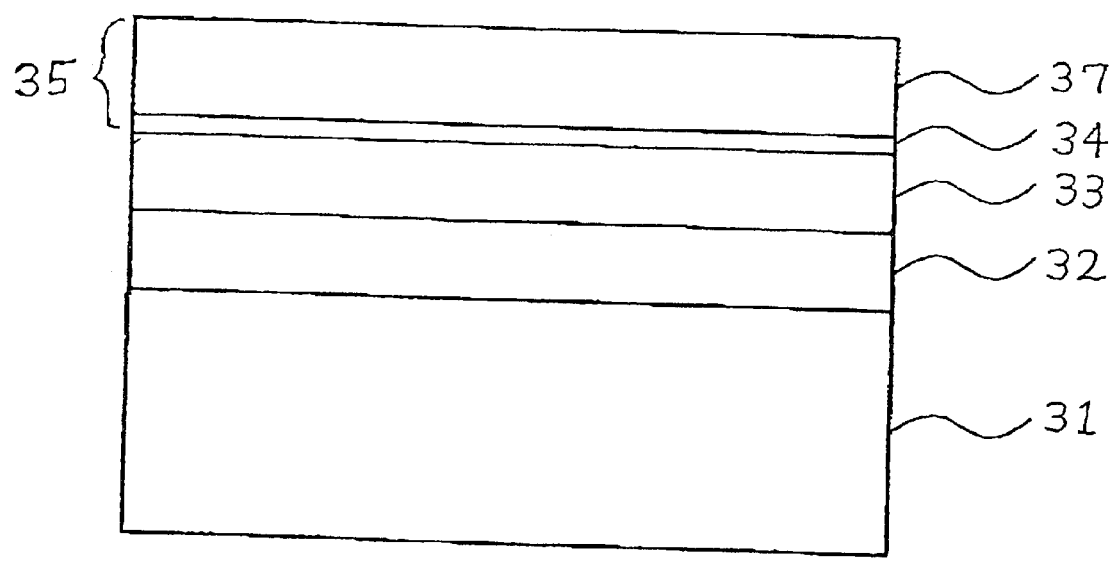
FIG. 6 is a fragmentary cross sectional elevation view illustrative of a novel thin film capacitor with an improved top electrode structure in a third embodiment in accordance with the present invention.

A third aspect of the embodiment according to the present invention will be described in detail with reference to FIG. 6 which is a fragmentary cross sectional elevation view illustrative of a novel thin film capacitor with an improved top electrode structure.

An n-type silicon substrate 31 having a resistivity of 0.1 Ωcm was prepared. A bottom electrode 32 of RuO$_2$ having a thickness of 200 nanometers was deposited on the silicon substrate 31 by a first DC sputtering method. An electron cyclotron resonance chemical vapor deposition method was carried out by use of Ba(DPM)$_2$, Sr(DPM)$_2$, Ti(i-OC$_3$H$_7$) and oxygen gases under conditions of a substrate temperature of 500° C. a gas pressure of 7 mTorr, and a plasma excitation microwave power of 500 W, thereby depositing a (Ba, Sr)TiO$_3$ high dielectric oxide layer 33 with a thickness of 30 nanometers on the bottom electrode 32.

A second DC sputtering method was carried out under deposition conditions of a deposition temperature of 25° C., a gas pressure of 4 mTorr, and a DC power of 1.7 W/cm$^2$, and a deposition rate of 16 nanometers/min. thereby depositing a Pt first conductive layer 34 with a thickness of 5 nanometers on the (Ba, Sr)TiO$_3$ high dielectric oxide layer 33.

A third DC sputtering method was then carried out under deposition conditions of a deposition temperature of 25° C., a gas pressure of 4 mTorr, and a DC power of 4.5 W/cm$^2$, and a deposition rate of 21 nanometers/min. thereby depositing an Ru second conductive layer 37 with a thickness of 50 nanometers on the Pt first conductive layer 34. As a result, the novel thin film capacitor was completed.

Figure 7:
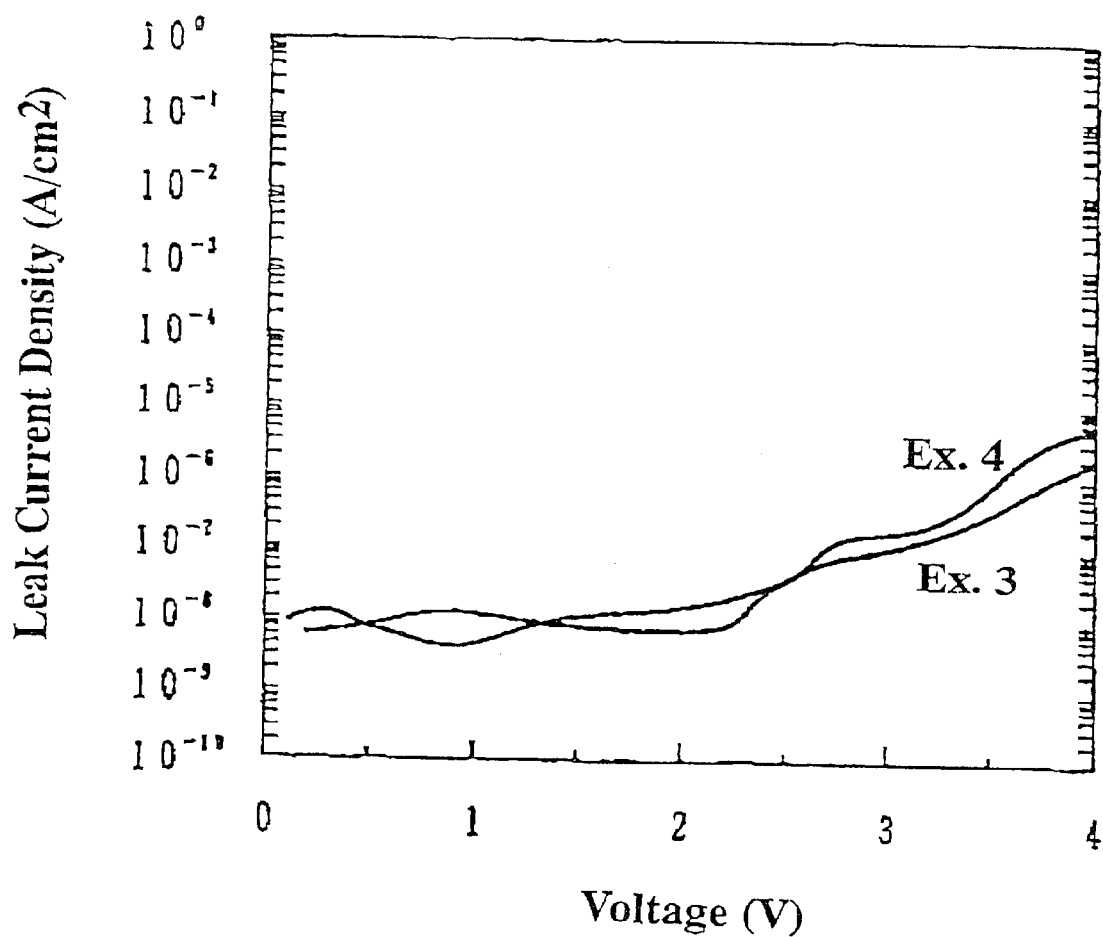
FIG. 7 is a diagram illustrative of variations in density of leak current of the novel thin film capacitor with the improved Pt/Ru double-layered structure and the conventional thin film with the Ru single-layered structure.

Thereafter, the novel thin film capacitor was placed in oxygen and nitrogen gases at a temperature of 500° C. for 30 minutes. FIG. 7 is a diagram illustrative of variations in density of leak current of the novel thin film capacitor with the improved Pt/Ru double-layered structure and the conventional thin film with the Ru single-layered structure. It was shown that the first deposition rate for depositing the Pt first conductive layer 34 is not necessarily higher than the second deposition rate for depositing the Ru second conductive layer 37.

FIG. 7 apparently shows that the novel thin film capacitor with the improved double-layered top electrode shows good current leakage characteristics, for example, a low leak current density of not less than 1×10$^{-8}$ A/cm$^2$ upon zero driving voltage application to the thin film capacitor. Upon increase in the driving voltage from 0V to about 2V, the above low leak current density almost remains unchanged. For example, under the application of the driving voltage of 2V to the novel thin film capacitor, the leak current density remains not less than 1×10$^{-8}$ A/cm$^2$. Namely, the novel thin film capacitor shows the stable and good leak characteristics.

The adhesiveness of the Pt first conductive layer 34 to the (Ba, Sr)TiO$_3$ high dielectric oxide layer 33 was also evaluated by varying the thickness of the Pt first conductive layer 34 in the range of 5–20 nanometers. It was confirmed that as the thickness of the Pt first conductive layer 34 is reduced, the adhesiveness of the Pt first conductive layer 34 to the (Ba, Sr)TiO$_3$ high dielectric oxide layer 33 is improved. For example, a preferable thickness range of the Pt first conductive layer 34 is not thicker than 10 nanometers.

The above novel thin film capacitor with the improved double-layered top electrode structure possesses the following advantages and effects.

First, the above novel thin film capacitor has the good electric characteristics. The material of the first conductive layer in contact with the high dielectric oxide layer is so selected as to have a low oxidizability and a low diffusability into the high dielectric oxide layer, whereby it is possible to prevent a reaction such as oxidation on an interface between the first conductive layer and the high dielectric oxide layer as well as prevent the high dielectric oxide layer from receipt of any substantive damage.

Second, the double-layered top electrode structure makes it possible to shorten the time for deposition of the top electrode for improvement in throughput of the thin film capacitor. The first conductive layer is deposited at a sufficiently low deposition rate for prevent the top surface of the high dielectric oxide layer from receiving any substantive damage, whilst the second conductive layer is deposited at a sufficiently high deposition rate for shortening a total time for depositions of the first and second conductive layers Third, the first conductive layer intervening between the second conductive layer an the high dielectric oxide layer prevents peeling of the top electrode from the high dielectric oxide layer for improvement in the yield of the thin film capacitor.

Fourth, the material of the second conductive layer is so selected as to have a high formability to a reactive ion etching, whilst the first conductive layer made of a material with a low formability is formed much thinner than the second conductive layer The improvement in formability of the top electrode allows a further scaling down of the thin film capacitor with a highly accurate dimension, whereby a further increase in the degree of integration of the semiconductor devices can be realized.

The following descriptions will focus on possible modification to the above present invention In this embodiment, the bottom electrode is made of RuO$_2$. Notwithstanding, conductive materials are available for the bottom electrode, which are capable of keeping conductivity in an oxygen atmosphere during the process for formation of the high dielectric oxide layer on the bottom electrode. For example, there are available for the bottom electrode material Ru. Ir, Rc, Os, Rh, and oxides thereof as well as at least any one selected from the group of silicide compounds in addition at least any one selected from the group of Pt, Au, Ag, Pd, Ni, Co and alloys thereof.

Further, the bottom electrode may be modified to have multilayer structure.

In place of (Ba, Sr)TiO$_3$, materials represented by a chemical formula ABO$_3$ are available for the high dielectric oxide layer, wherein A may comprise at least any one selected from the group consisting of Ba, Sr, Pb, Ca, La, Li and K, and B may comprise at least any one selected from the group consisting of Ti, Zr, Ta, Nb, Mg, Fe, Zn and W. For example, there are available SrTiO$_3$, (Sr, Ca)TiO$_3$, (Ba, Sr, Ca)TiO$_3$, PbTiO$_3$, Pb(Zr, Ti)O$_3$, (Pb, La)(Zr, Ti)O$_3$, Pb(Mg, Nb)O$_3$, Pb(Mg, W)O$_3$, Pb(Zn, Nb)O$_3$LiTaO$_3$, LiNbO$_3$, KTaO$_3$, KTaO$_3$, and KNbO$_3$. Further, there are available materials represented by the chemical formula (Bi$_2$O$_2$) (A$_{m-1}$B$_m$O$_{3m+1}$) (m=1, 2, 3, 4, 5), wherein A may comprise at least any one selected from the group consisting of Ba, Sr, Pb, Ca, K and Bi, and B may comprise at least any one selected from the group consisting of Nb, Ta, Ti, and W. For example, Ba$_4$Ti$_3$O$_{12}$, SrBa$_2$Ta$_2$O$_9$, and SrBa$_2$Nb$_2$O$_9$ are also available. In addition, Ta$_2$O$_5$ is further available which has a chemical composition different from those of the above chemical formula.

The above high dielectric oxide layer may be modified to have a multi-layered structure.

Figure 8:
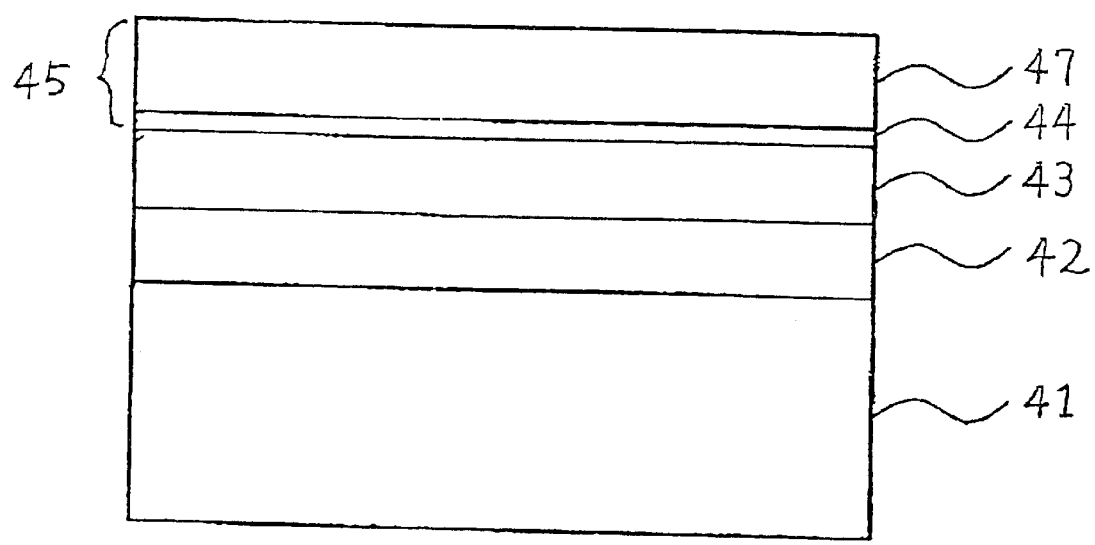
FIG. 8 is a fragmentary cross sectional elevation view illustrative of a novel thin film capacitor with an improved top electrode structure in a fourth embodiment in accordance with the present invention.

A fourth aspect of the embodiment according to the present invention will be described in detail with reference to FIG. 8 which is a fragmentary cross sectional elevation view illustrative of a novel thin film capacitor with an improved top electrode structure.

An n-type silicon substrate 41 having a resistivity of 0.1 Ωcm was prepared. A bottom electrode 42 of RuO$_2$ having a thickness of 200 nanometers was deposited on the silicon substrate 41 by a first DC sputtering method. An electron cyclotron resonance chemical vapor deposition method was carried out by use of Ba(DPM)$_2$, Sr(DPM)$_2$, Ti(i-OC$_3$H$_7$) and oxygen gases under conditions of a substrate temperature of 500° C., a gas pressure of 7 mTorr, and a plasma excitation microwave power of 500 W, thereby depositing a (Ba, Sr)TiO$_3$ high dielectric oxide layer 43 with a thickness of 30 nanometers on the bottom electrode 42.

A second DC sputtering method was carried out under deposition conditions of a deposition temperature of 25° C., a gas pressure of 4 mTorr, and a DC power of 1.7 W/cm$^2$, and a deposition rate of 16 nanometers/min. thereby depositing a Pt first conductive layer 44 with a thickness of 5 nanometers on the (Ba, Sr)TiO$_3$ high dielectric oxide layer 43.

A third DC sputtering method was then carried out under deposition conditions of a deposition temperature of 25° C., a gas pressure of 4 mTorr, and a DC power of 4.5 W/cm$^2$, and a deposition rate of 21 nanometers/min. thereby depositing an Ru second conductive layer 47 with a thickness of 100 nanometers on the Pt first conductive layer 44. As a result, the novel thin film capacitor was completed.

Thereafter, the novel thin film capacitor was placed in oxygen and nitrogen gases at a temperature of 500° C. for 30 minutes FIG. 7 apparently shows that the novel thin film capacitor with the improved double-layered top electrode shows good current leakage characteristics, for example, a low leak current density of not less than 1×10$^{-8}$ A/cm$^2$ upon zero driving voltage application to the thin film capacitor. Upon increase in the driving voltage from 0V to about 2V, the above low leak current density almost remains unchanged. For example, under the application of the driving voltage of 2V to the novel thin film capacitor, the leak current density remains not less than 1×10$^{-8}$ A/cm$^2$. Namely, the novel thin film capacitor shows the stable and good leak characteristics.

The adhesiveness of the Pt first conductive layer 44 to the (Ba, Sr)TiO$^3$ high dielectric oxide layer 43 was also evaluated by varying the thickness of the Pt first conductive layer 44 in the range of 5–20 nanometers. It was confirmed that as the thickness of the Pt first conductive layer 44 is reduced, the adhesiveness of the Pt first conductive layer 44 to the (Ba, Sr)TiO$_3$ high dielectric oxide layer 43 is improved. For example, a preferable thickness range of the Pt first conductive layer 44 is not thicker than 10 nanometers.

It was also confirmed that the leak current characteristics of the thin film capacitor are independent from the thickness of the Ru second conductive layer 47. This means that the Ru second conductive layer 47 may have a further increased thickness, for example, in the range of 150–200 nanometers.

The above novel thin film capacitor with the improved double-layered top electrode structure possesses the following advantages and effects.

First, the above novel thin film capacitor has the good electric characteristics. The material of the first conductive layer in contact with the high dielectric oxide layer is so selected as to have a low oxidizability and a low diffusability into the high dielectric oxide layer, whereby it is possible to prevent a reaction such as oxidation on an interface between the first conductive layer and the high dielectric oxide layer as well as prevent the high dielectric oxide layer from receipt of any substantive damage.

Second, the double-layered top electrode structure makes it possible to shorten the time for deposition of the top electrode for improvement in throughput of the thin film capacitor. The first conductive layer is deposited at a sufficiently low deposition rate for prevent the top surface of the high dielectric oxide layer from receiving any substantive damage, whilst the second conductive layer is deposited at a sufficiently high deposition rate for shortening a total time for depositions of the first and second conductive layers.

Third, the first conductive layer intervening between the second conductive layer an the high dielectric oxide layer prevents peeling of the top electrode from the high dielectric oxide layer for improvement in the yield of the thin film capacitor.

Fourth, the material of the second conductive layer is so selected as to have a high formability to a reactive ion etching, whilst the first conductive layer made of a material with a low formability is formed much thinner than the second conductive layer. The improvement in formability of the top electrode allows a further scaling down of the thin film capacitor with a highly accurate dimension, whereby a further increase in the degree of integration of the semiconductor devices can be realized.

The following descriptions will focus on possible modification to the above present invention. In this embodiment, the bottom electrode is made of RuO$_2$. Notwithstanding, conductive materials are available for the bottom electrode, which are capable of keeping conductivity in an oxygen atmosphere during the process for formation of the high dielectric oxide layer on the bottom electrode. For example, there are available for the bottom electrode material Ru, Ir, Re, Os, Rh, and oxides thereof as well as at least any one selected from the group of silicide compounds in addition at least any one selected from the group of Pt, Au, Ag, Pd, Ni, Co and alloys thereof Further, the bottom electrode may be modified to have multi-layer structure.

In place of (Ba, Sr)TiO$_3$, materials represented by a chemical formula ABO$_3$ are available for the high dielectric oxide layer, wherein A may comprise at least any one selected from the group consisting of Ba, Sr, Pb, Ca, La, Li and K, and B may comprise at least any one selected from the group consisting of Ti, Zr, Ta, Nb, Mg, Fe, Zn and W. For example, there are available SrO$_3$, (Sr, Ca)TiO$_3$, (Ba, Sr, Ca)TiO$_3$, PbTiO$_3$, Pb(Zr, Ti)O$_3$, (Pb, La)(Zr, Ti)O$_3$, Pb(Mg, Nb)O$_3$, Pb(Mg, W)O$_3$, Pb(Zn, Nb)O$_3$LiTaO$_3$, LiNbO$_3$, KTaO$_3$, KTaO$_3$, and KNbO$_3$. Further, there are available materials represented by the chemical formula (Bi$_2$O$_2$) (A$_{m-1}$B$_m$O$_{3m+1}$) (m=1, 2, 3, 4, 5), wherein A may comprise at least any one selected from the group consisting of Ba, Sr, Pb, Ca, K and Bi, and B may comprise at least any one selected from the group consisting of Nb, Ta, Ti, and W. For example, Ba$_4$Ti$_3$O$_2$, SrBa$_2$Ta$_2$O$_9$, and SrBa$_2$Nb$_2$O$_9$ are also available. In addition, Ta$_2$O$_5$ is further available which has a chemical composition different from those of the above chemical formula.

The above high dielectric oxide layer may be modified to have a multi-layered structure.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A multi-layer structure comprising:
   a dielectric oxide layer; and
   an electrode having a first conductive layer directly on and contacting said dielectric oxide layer and a second conductive layer directly on and contacting said first conductive layer,
   wherein said first conductive layer processes at least one of a lower oxidizability and a lower diffusability than said second conductive layer.

2. The multi-layer structure as claimed in claim 1, wherein said first conductive layer processes both said lower oxidizability and said lower diffusability than said second conductive layer.

3. The multi-layer structure as claimed in claim 2, wherein said first conductive layer includes at least any one of Pt, Au, Ag, Pd, Ni, Co and alloys thereof.

4. The multi-layer structure as claimed in claim 1, wherein said second conductive layer processes a higher formability than said first conductive layer.

5. The multi-layer structure as claimed in claim 4, wherein said second conductive layer processes a higher formability to a reactive ion etching than said first conductive layer.

6. The multi-layer structure as claimed in claim 5, wherein said second conductive layer includes at least any one of Ru, $RuO_2$, Ir, $IrO_2$, and alloys thereof.

7. The multi-layer structure as claimed in claim 1, wherein said dielectric oxide layer comprises a high dielectric oxide layer.

8. The multi-layer structure as claimed in claim 7, wherein said high dielectric oxide layer consists essentially of (Ba, Sr)$TiO_3$.

9. A multi-layer structure comprising:
   a dielectric oxide layer;
   a first conductive layer on said dielectric oxide layer; and
   a second conductive layer over said first conductive layer,
      wherein said first conductive layer processes at least any one of a lower oxidizability and a lower diffusability than said second conductive layer,
         wherein said first conductive layer has a thickness in the range of one-tenth to one-twentieth of a thickness of said second conductive layer.

10. The multi-layer structure as claimed in claim 1, wherein said first conductive layer comprises Pt and said second conductive layer comprises one of Ru and Ir.

11. The multi-layer structure as claimed in claim 1, wherein said second conductive layer has a single-layered structure.

12. A multi-layer structure comprising:
   a dielectric oxide layer;
   a first conductive layer on said dielectric oxide layer; and
   a second conductive layer over said first conductive layer,
      wherein said first conductive layer processes at least any one of a lower oxidizability and a lower diffusability than said second conductive layer,
         wherein an interface between said first conductive layer and said dielectric oxide layer is such that a density of a leak current across said interface is suppressed at not higher than $1 \times 10^{-4}$ A/$cm^2$ upon applying a voltage of 2V across said dielectric oxide layer.

13. A top electrode structure of a thin film capacitor, said structure comprising:
   an intervening conductive layer directly on and contacting a dielectric oxide layer; and
   a top electrode layer directly on and contacting said intervening conductive layer, and said top electrode layer being thicker than said intervening conductive layer,
      wherein said intervening conductive layer processes at least one of a lower oxidizability and a lower diffusability than said top electrode layer.

14. The structure as claimed in claim 13, wherein said intervening conductive layer processes both said lower oxidizability and said lower diffusability than said top electrode layer.

15. The structure as claimed in claim 14, wherein said intervening conductive layer includes at least any one of Pt, Au, Ag, Pd, Ni, Co and alloys thereof.

16. The structure as claimed in claim 13, wherein said top electrode layer processes a higher formability than said intervening conductive layer.

17. The structure as claimed in claim 16, wherein said top electrode layer processes a higher formability to a reactive ion etching than said intervening conductive layer.

18. The structure as claimed in claim 17, wherein said top electrode layer includes at least any one of Ru, $RuO_2$, Ir, $IrO_2$, and alloys thereof.

19. The structure as claimed in claim 13, wherein said dielectric oxide layer comprises a high dielectric oxide layer.

20. The structure as claimed in claim 19, wherein said high dielectric oxide layer consists essentially of (Ba, ST)$TiO_3$.

21. A top electrode structure of a thin film capacitor, said structure comprising:
   an intervening conductive layer on a dielectric oxide layer; and
   a top electrode layer over said intervening conductive layer, and said top electrode layer being thicker than said intervening conductive layer,
      wherein said intervening conductive layer processes at least any one of a lower oxidizability and a lower diffusability than said top electrode layer,
         wherein said intervening conductive layer has a thickness in the range of one-tenth to one-twentieth of a thickness of said top electrode layer.

22. The structure as claimed in claim 13, wherein said intervening conductive layer comprises Pt and said second conductive layer comprises one of Ru and Ir.

23. The structure as claimed in claim 13, wherein said top electrode layer has a single-layered structure.

24. A top electrode structure of a thin film capacitor, said structure comprising:
   an intervening conductive layer on a dielectric oxide layer; and
   a top electrode layer over said intervening conductive layer, and said top electrode layer being thicker than said intervening conductive layer,
      wherein said intervening conductive layer processes at least any one of a lower oxidizability and a lower diffusability than said top electrode layer,
         wherein a density of a leak current of said thin film capacitor is suppressed at not higher than $1 \times 10^{-4}$ A/$cm^2$ upon applying a voltage of 2V to said thin film capacitor.

* * * * *